(12) United States Patent
Suh et al.

(10) Patent No.: US 7,900,170 B2
(45) Date of Patent: Mar. 1, 2011

(54) SYSTEM AND METHOD CORRECTING OPTICAL PROXIMITY EFFECT USING PATTERN CONFIGURATION DEPENDENT OPC MODELS

(75) Inventors: Sung-Soo Suh, Yongin-si (KR);
Young-Seog Kang, Yongin-si (KR);
Han-Ku Cho, Seongnam-si (KR);
Sang-Gyun Woo, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 865 days.

(21) Appl. No.: 11/585,086

(22) Filed: Oct. 24, 2006

(65) Prior Publication Data

US 2007/0094635 A1 Apr. 26, 2007

(30) Foreign Application Priority Data

Oct. 24, 2005 (KR) ...................... 10-2005-0100405

(51) Int. Cl.
*G06F 17/50* (2006.01)
(52) U.S. Cl. ....................................................... 716/53
(58) Field of Classification Search ...................... 716/4, 716/19–21; 430/5, 30
See application file for complete search history.

(56) References Cited

U.S. PATENT DOCUMENTS 6,539,521 B1 * 3/2003 Pierrat et al. ................... 716/4

(Continued)

FOREIGN PATENT DOCUMENTS

| JP | 2000-235248 | 8/2000 |
|---|---|---|
| JP | 2002-107902 | 4/2002 |
| JP | 2002-311561 | 10/2002 |
| JP | 2004-177944 | 6/2004 |
| JP | 3615182 | 11/2004 |
| JP | 2005-156606 | 6/2005 |
| KR | 1020040050859 A | 6/2004 |
| KR | 10-2004-0073960 | 8/2004 |

OTHER PUBLICATIONS

English Abstract of JP 2003-162041.

*Primary Examiner*—Vuthe Siek
(74) *Attorney, Agent, or Firm*—Harness, Dickey & Pierce, P.L.C.

(57) ABSTRACT

An optical proximity correction (OPC) system and methods thereof are provided. The example OPC system may include an integrated circuit (IC) layout generation unit generating an IC layout, a database unit storing a first plurality of OPC models, each of the first plurality of OPC models associated with one of a plurality of target specific characteristics and a mask layout generation unit including a model selector selecting a second plurality of OPC models based on a comparison between the target specific characteristics associated with the plurality of OPC models and the generated IC layout, the mask layout generation unit generating a mask layout based on the IC layout and the selected second plurality of OPC models. A first example method may include storing a first plurality OPC models, each of the first plurality of OPC models associated with one of a plurality of target specific characteristics, generating an IC layout, selecting a second plurality of OPC models based on a comparison between the target specific characteristics associated with the first plurality of OPC models and the generated IC layout and generating a mask layout based on the generated IC layout and the selected second plurality of OPC models. A second example method may include applying a first OPC model to a first portion of a generated integrated circuit (IC) layout, applying a second OPC model to a second portion of the generated IC layout and generating a mask layout based on the generated IC layout after the application of the first and second OPC models.

23 Claims, 18 Drawing Sheets

U.S. PATENT DOCUMENTS

| | | | |
|---|---|---|---|
| 7,065,738 B1 * | 6/2006 | Kim | 716/19 |
| 7,536,670 B2 * | 5/2009 | Percin et al. | 716/19 |
| 2002/0199157 A1 * | 12/2002 | Cobb | 716/1 |
| 2005/0081179 A1 * | 4/2005 | Melvin, III | 716/20 |
| 2005/0149902 A1 * | 7/2005 | Shi et al. | 716/21 |

* cited by examiner

Mask Pattern

Pattern Developed on Wafer 21  22

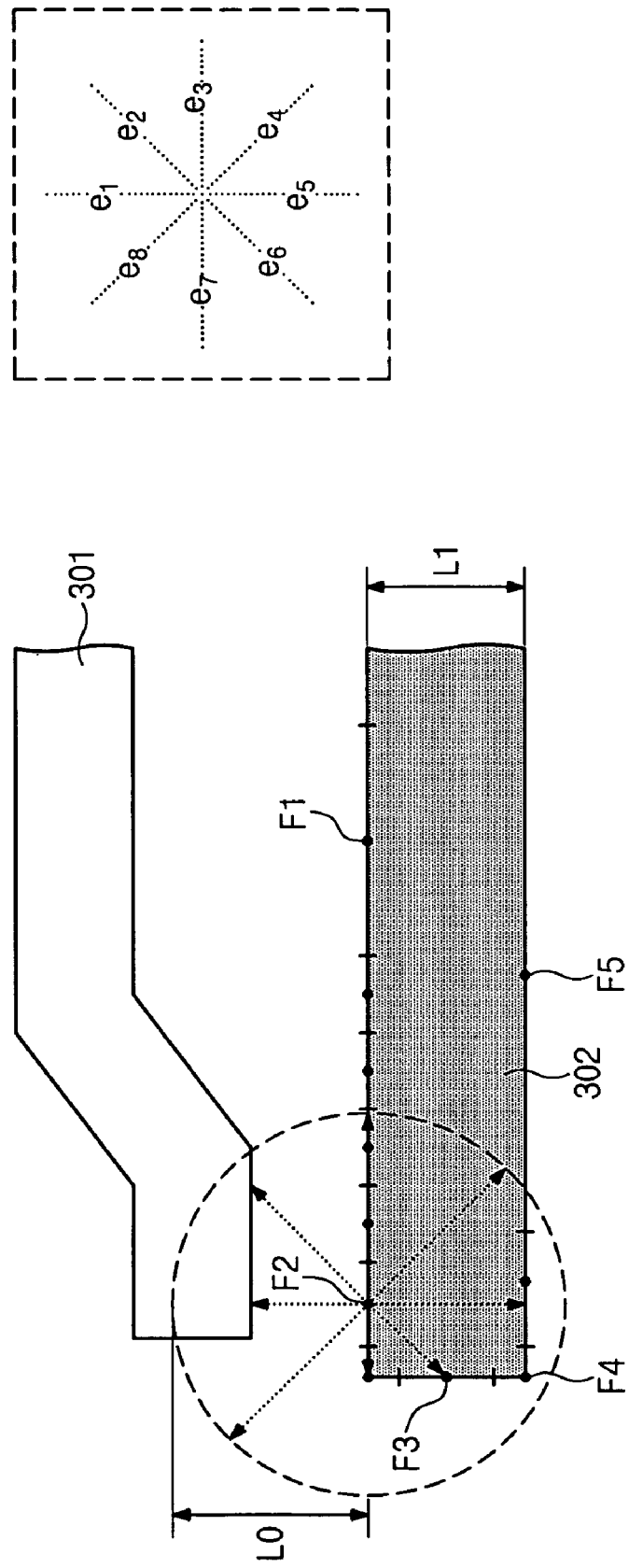

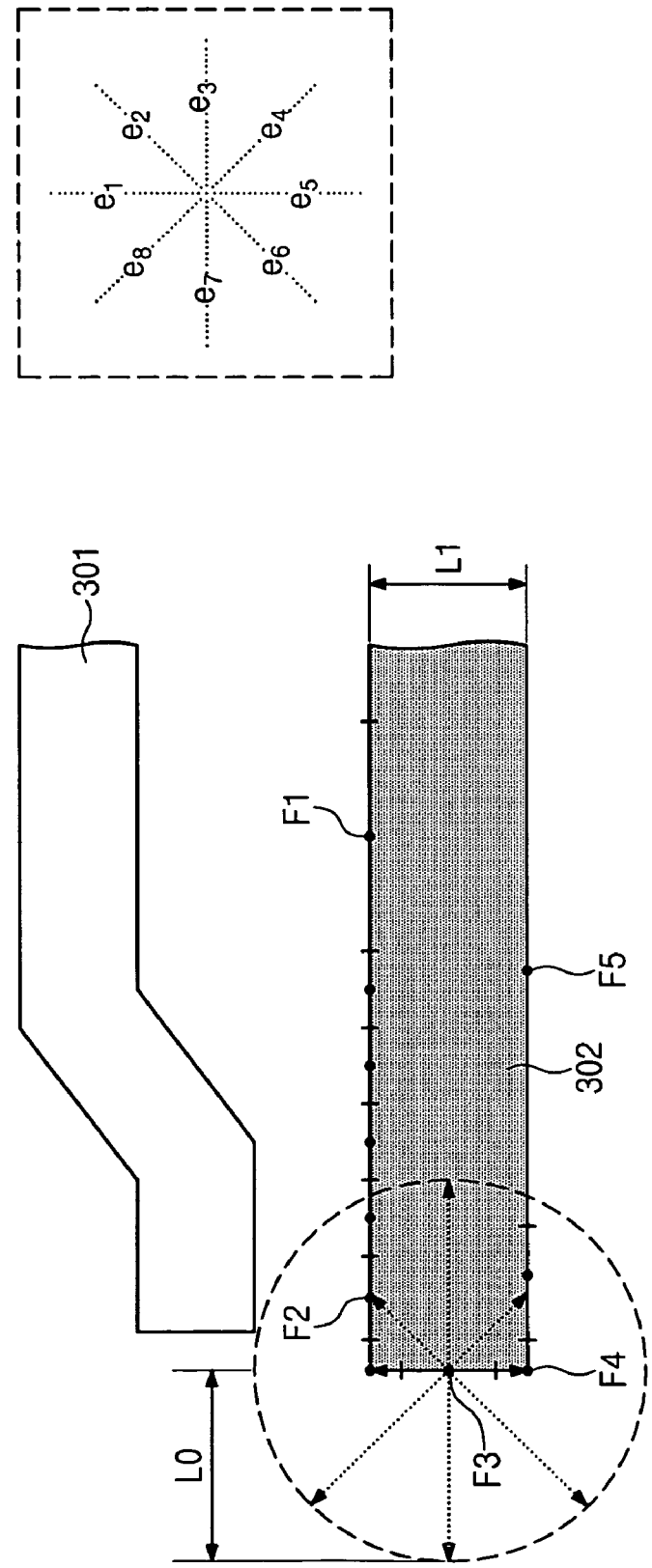

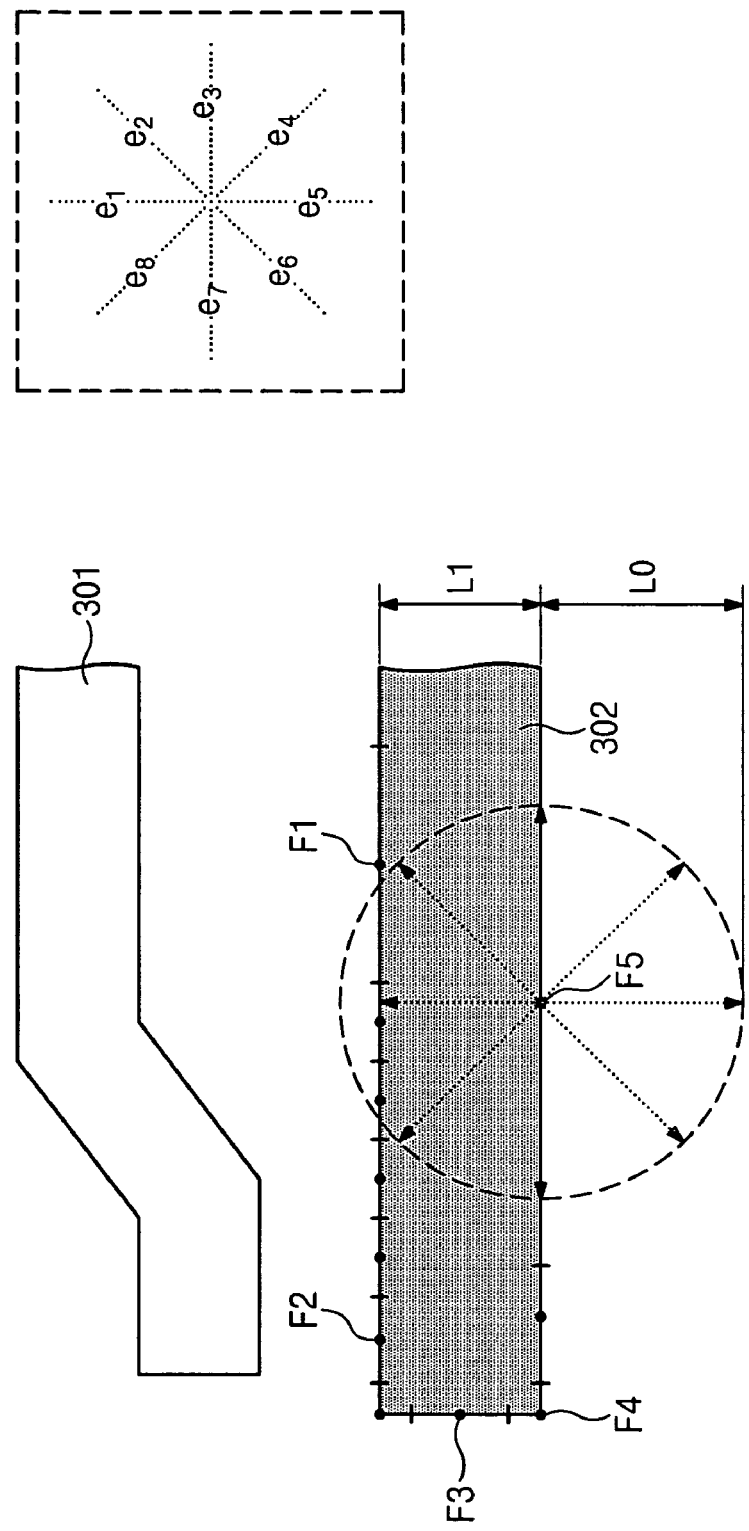

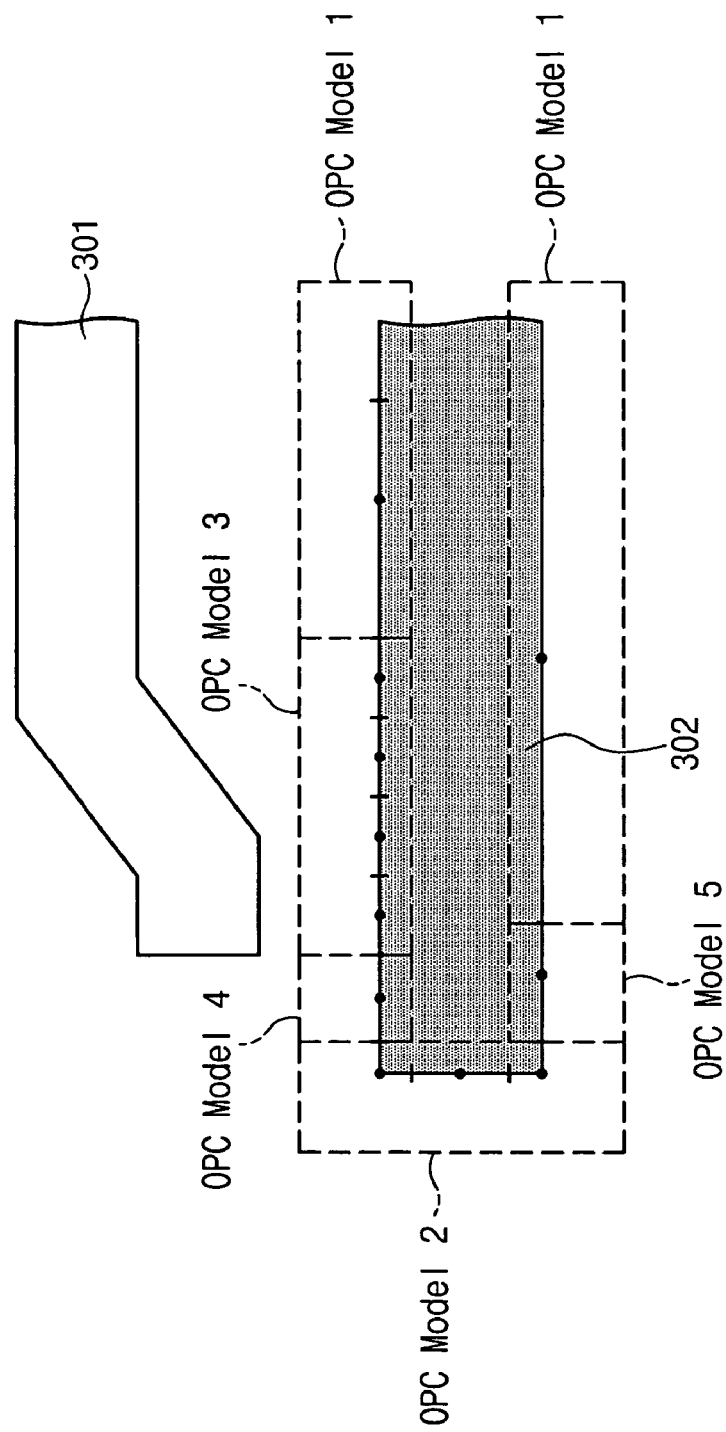

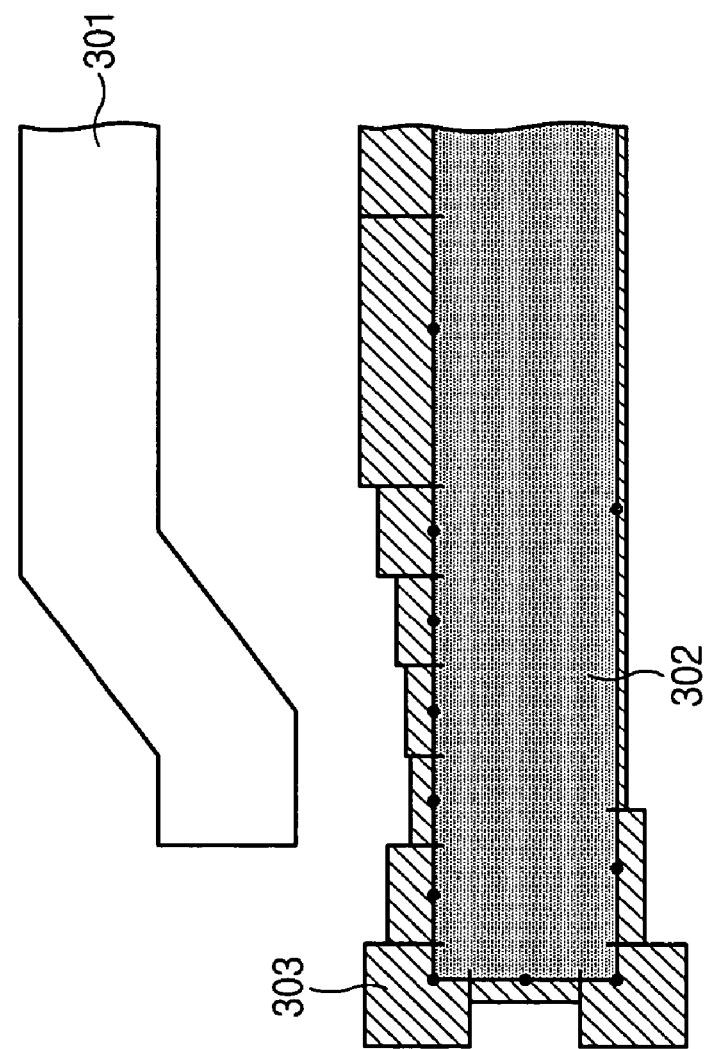

SYSTEM AND METHOD CORRECTING OPTICAL PROXIMITY EFFECT USING PATTERN CONFIGURATION DEPENDENT OPC MODELS

PRIORITY STATEMENT

This U.S. non-provisional patent application claims priority under 35 U.S.C. §119 of Korean Patent Application 2005-100405 filed on Oct. 24, 2005, the entire contents of which are hereby incorporated by reference.

BACKGROUND OF THE INVENTION

1. Field of the Invention

Example embodiments of the present invention are generally related to an optical proximity correction (OPC) system and methods thereof, and more particularly related to an OPC system and methods of adjusting an integrated circuit (IC) layout to generate a mask pattern.

2. Description of the Related Art

Lithography technology used for fabricating semiconductor devices may employ a process of transcribing a pattern, which may be formed on a photomask through an optical lens, onto a wafer. With increasing integration density of semiconductor devices, the dimensions of mask patterns may approximate wavelengths of light, such that the lithography process may be increasingly affected by diffraction and interference of light.

FIG. 1A illustrates a conventional mask pattern. FIG. 1B illustrates a conventional photoresist pattern formed by the mask pattern of FIG. 1A. A review of FIGS. 1A and 1B may reveal that as optical systems projecting light function as low-pass filters, photoresist patterns arranged on wafers (e.g., FIG. 1B) may be distorted from their "original" mask patterns (e.g., FIG. 1A).

Because a spatial frequency may be lower if a mask pattern is larger in size or is transferred with a higher number of repetitions, many different frequencies may be capable of transmitting the mask pattern, resulting in a structural pattern which may approximate an original mask pattern onto a wafer. However, generally, portions of higher frequencies may cause pattern distortions in "roundish" shapes. Such pattern distortions may be caused by an "optical proximity effect" (OPE). Because the spatial frequency may increase as a pattern size is reduced, the number of frequencies permissible to transmit the reduced pattern may decrease such that the pattern distortion due to OPE may likewise become more severe.

Optical proximity correction (OPC) may at least partially reduce pattern distortion due to OPE. OPC may involve adjusting an expected pattern distortion by intentionally altering an original mask pattern. OPC may improve an optical resolution and a pattern transfer fidelity. A conventional OPC process may include adding or removing small patterns, which may typically be less than the designed resolution, to or from a mask pattern associated with the photomask (e.g., line-end treatment or insertion of scattering bars).

FIG. 2A illustrates a line-end treatment during a conventional OPC process. As shown in FIG. 2A, a line-end treatment may include adding corner serif or hammer patterns to an original mask pattern in order to reduce "roundish" or rounded patterns of line edges.

FIG. 2B illustrates a scattering bar insertion during a conventional OPC process. As shown in FIG. 2B, scattering bar insertion may be conducted by adding sub-resolution scattering bars around target patterns in order to reduce variation of line widths by pattern density.

After a photolithography processing technique, design rule checking (DRC), an electrical rule checking, electrical parameter evaluation (EPE), and the process of layout-versus-schematic (LVS) according to checking and evaluation operations, and a layout process may be performed. Further, an additional step of intentionally altering a layout pattern using an OPC process may be performed.

OPC processes may be generally classified as a rule-based process processing layout data (e.g., employing rules established by a number of lithography engineers), and a model-based process correcting a layout configuration based on a mathematical model of the lithography system.

The conventional rule-based process may be carried out by altering or adjusting a layout based on one or more rules, such as partially cutting away primitive patterns and/or adding subsidiary patterns thereto. The rule-based process may be performed relatively quickly because the layout data corresponding to the entire chip area may be affected at a given time. However, it may be difficult to establish valid rules to employ during the rule-based process (e.g., rules which work effectively for any number of possible mask transfers). For example, a tedious process of experimental trial and error may be performed in order to establish the rules. Further, the trial and error process may continue indefinitely as new rules are employed to further optimize the system.

The model-based process may be conducted by correcting deformation of mask patterns by applying a model of lithography system to a negative feedback system. Based on repetitive calculation, the model-based process may consume a significant amount of time and processing power to simulate a relatively small amount of data. However, the model-based process may be more likely than the rule-based process to eventually arrive at an "optimized" solution for the OPC process irrespective of a configuration of pattern. The model-based process may arrive at an acceptable solution even if no rules have been previously established (e.g., via the rule-based process), and further may be used to find a rules for an application of the rule-based process. Accordingly, acceptable mathematical solutions may be obtained for various mask patterns with less actual experimentation (e.g., and more simulations). As a result, if time and expense is not a factor, lithography engineers may employ the conventional model-based process for patterning memory cells.

The conventional model-based OPC process may include generating a mask layout corresponding to the shape of a pattern selected on based on a given OPC model after dividing a layout pattern of an integrated circuit (IC) into a plurality of fragments. However, the given OPC model may typically not model particular shapes of selected patterns and the features of dispositions with peripheral patterns. For example, if a single OPC model is applied to an entire layout (e.g., to each of the plurality of fragments), it may be difficult to accomplish an optimum pattern correction because fluctuations or subtleties in the layout (e.g., the shapes and dispositions of patterns) may generally be ignored in favor of the more idealized or theoretical OPC model (e.g., the OPC model may not be "fine-tuned" for each of the fragments).

FIG. 3 is a graphic diagram showing gaps of fitting errors according to pattern architecture appearing through a conventional OPC process. FIG. 4 is a graphic diagram showing fitting errors of a conventional OPC process employing a single OPC model.

As shown in FIGS. 3 and 4, although an OPC model may be applied thereto in accordance with the conventional scheme, fitting errors may be different from each other in uniformity by the structures of patterns. For example, the line-end structure 10 may include a larger distribution profile of fitting errors, due to a concentration by OPE thereon, than that of a line-and-space or block structure.

Referring to FIGS. 3 and 4, a large distribution profile of fitting errors may make the model-based OPC process difficult to apply usefully within a higher-density semiconductor device.

FIG. 5 illustrates a portion of the pattern architecture that may not be fixed by the conventional OPC process.

Referring to FIG. 5, a semiconductor device may be fabricated including a line-end pattern 21, and peripheral patterns 22 adjacent to the line-end pattern 21. As intervals between the patterns become narrower along more highly integrated semiconductor devices, the conventional OPC process, having a relatively high distribution profile of fitting errors, may be insufficient for the structure shown in FIG. 5. As aforementioned, the large fitting-error distribution profile associated with the conventional OPC process may be at least partially based on an associated OPC model incapable of taking into consideration a selected pattern and/or a disposition structure of peripheral patterns around the selected pattern. Further, the conventional OPC process may not take into consideration various illumination characteristics (e.g., off-axis illumination), which may be associated with higher integration of semiconductor devices.

SUMMARY OF THE INVENTION

An example embodiment of the present invention is directed to an optical proximity correction (OPC) system, including an integrated circuit (IC) layout generation unit generating an IC layout, a database unit storing a first plurality of OPC models, each of the first plurality of OPC models associated with one of a plurality of target specific characteristics and a mask layout generation unit including a model selector selecting a second plurality of OPC models based on a comparison between the target specific characteristics associated with the plurality of OPC models and the generated IC layout, the mask layout generation unit generating a mask layout based on the IC layout and the selected second plurality of OPC models.

Another example embodiment of the present invention is directed to a method of correcting an optimal proximity effect (OPE), including storing a first plurality OPC models, each of the first plurality of OPC models associated with one of a plurality of target specific characteristics, generating an IC layout, selecting a second plurality of OPC models based on a comparison between the target specific characteristics associated with the first plurality of OPC models and the generated IC layout and generating a mask layout based on the generated IC layout and the selected second plurality of OPC models.

Another example embodiment of the present invention are directed to a method of correcting an OPE, including applying a first OPC model to a first portion of a generated integrated circuit (IC) layout, applying a second OPC model to a second portion of the generated IC layout and generating a mask layout based on the generated IC layout after the application of the first and second OPC models.

Another example embodiment of the present invention is directed to an OPC system and method for improving the accuracy of OPC.

Another example embodiment of the present invention is directed to an OPC system and method operable to process different shapes and dispositions of patterns.

BRIEF DESCRIPTION OF THE FIGURES

The accompanying drawings are included to provide a further understanding of the invention, and are incorporated in and constitute a part of this specification. The drawings illustrate example embodiments of the present invention and, together with the description, serve to explain principles of the present invention.

FIGS. 9A through 9E are diagrams illustrating a process of analyzing a pattern from a fragment and a disposition type of a peripheral pattern according to another example embodiment of the present invention.

FIG. 10 is a diagram illustrating an example of application with an OPC model in accordance with another example embodiment of the present invention.

FIG. 11 illustrates an example of a mask layout resulting from an OPC operation in accordance with another example embodiment of the present invention.

DETAILED DESCRIPTION OF EXAMPLE EMBODIMENTS OF THE PRESENT INVENTION

Figure 1A:
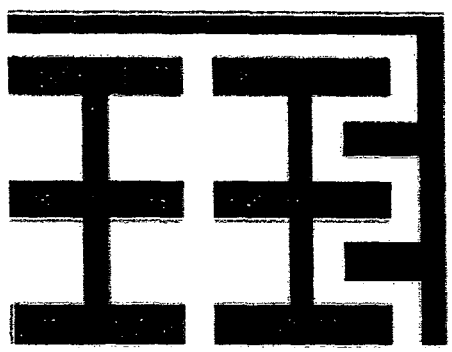
FIG. 1A illustrates a conventional mask pattern.
Figure 1B:
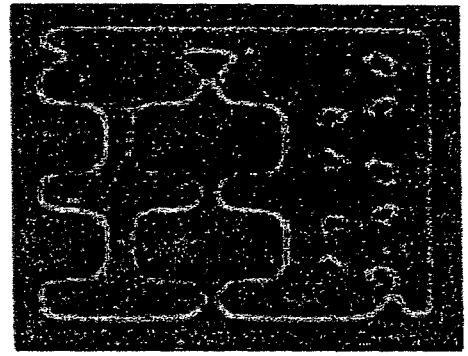
FIG. 1B illustrates a conventional photoresist pattern formed by the mask pattern of FIG. 1A.
Figure 2A:
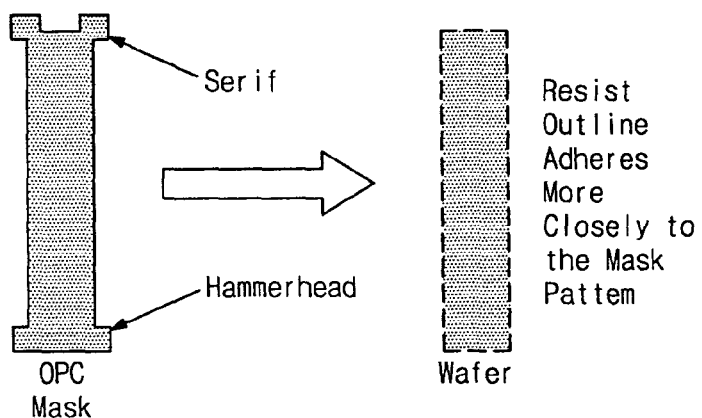
FIG. 2A illustrates a line-end treatment during a conventional OPC process.
Figure 2B:
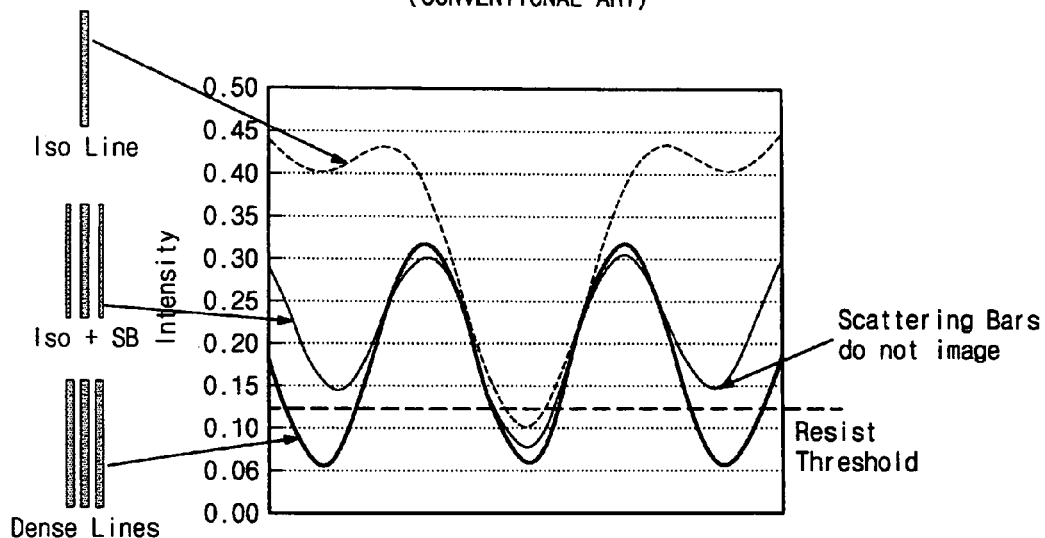
FIG. 2B illustrates a scattering bar insertion during a conventional OPC process.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 6:
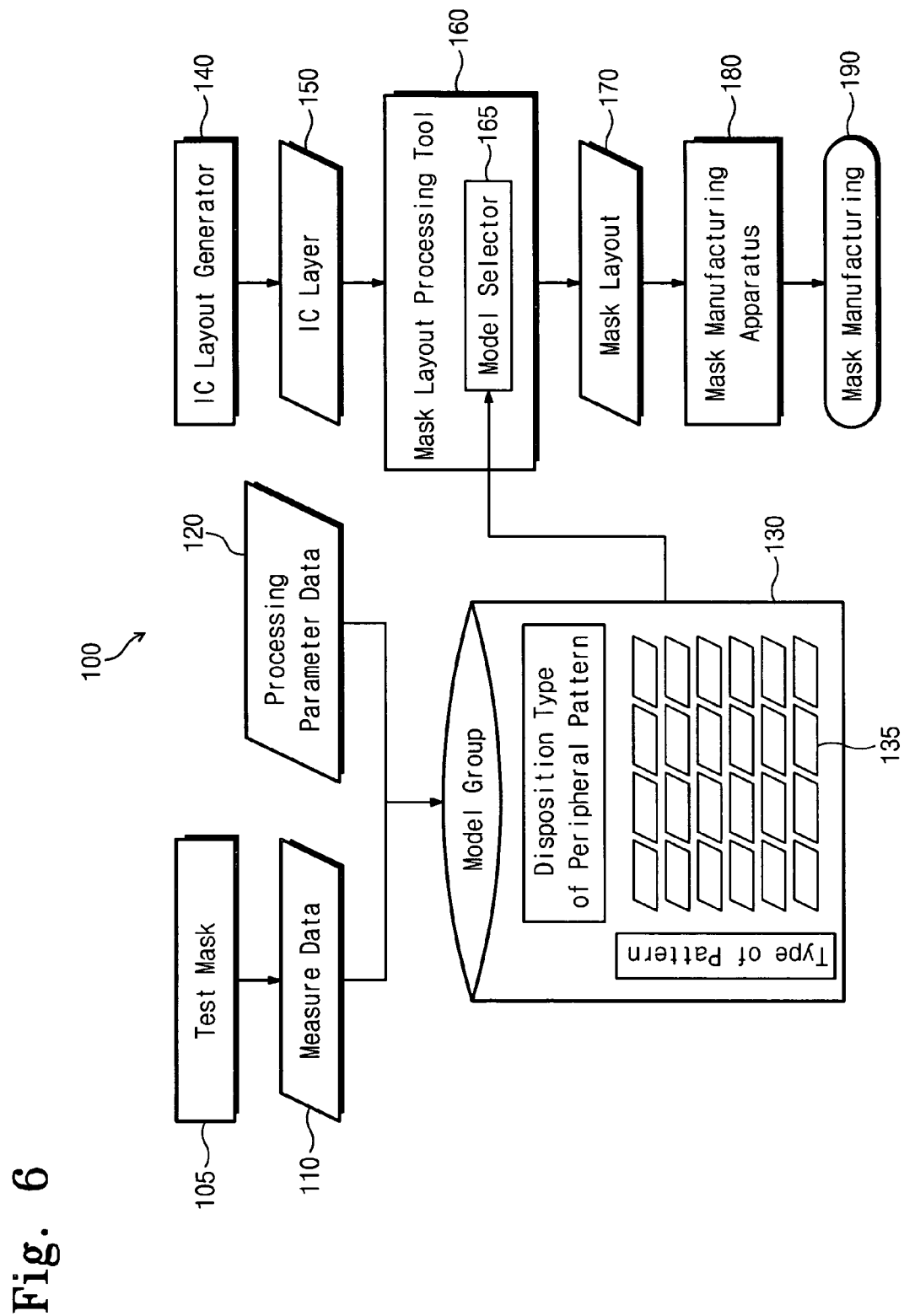
FIG. 6 illustrates an OPC system in accordance with an example embodiment of the invention.

FIG. 6 illustrates an optical proximity correction (OPC) system in accordance with an example embodiment of the invention.

In the example embodiment of FIG. 6, the OPC system 100 may include a mask layout processing tool 160 for generating a mask layout 170 from an integrated circuit (IC) layout 150. The IC layout 150 may include data having a suitable format (e.g., GDS II) for defining a target pattern, which may be printed on a wafer. The mask layout 170 may include data with a suitable format (e.g., GDS II) for defining a mask pattern, which may be formed on a photomask, and may serve to transfer the target pattern defined by the IC layout 150 on a wafer.

In the example embodiment of FIG. 6, in order to accurately reflect lithography processing effects in the procedure of printing the target pattern, the mask layout processing tool 160 may utilize lithography processing models 135 stored in a database unit 130. The lithography processing models 135 may be based on measured data 110 and processing parameter data 120. In an example, the measured data 110 and the processing parameter data 120 may be obtained experimentally.

In the example embodiment of FIG. 6, the measured data 110 may be obtained by analyzing resultant materials printed on a wafer using a test mask 105. In an example, the printed materials may include any of a number of patterns. The test mask 105 may be prepared to conform with numerous shapes and/or disposition structures of practical patterns (i.e., the target pattern) that may be reducible into an IC. For example, the test mask 105 may be configured to monitor various optical proximity effects (OPEs). Thereby, the lithography processing models 135 may be partitioned or organized within the database unit 130 based on types of patterns and peripheral patterns thereof. For example, a given pattern may be differentiated into a line-end type, a line-and-space type, an isolated bar type, and an isolated space type in accordance with types of patterns and dispositions. However, it is understood that such a list is non-limiting, and other example embodiments of the present invention may be directed to any type of pattern or peripheral pattern classification for the lithography processing models 135.

In the example embodiment of FIG. 6, the processing parameter data 120 may include experimental data for processing parameters that affects lithography and etching operations, quantitatively representing variations of processing results by the processing parameters. For example, the processing parameter data 120 may include information associated with an illumination system, which may be empirically generated (e.g., based on an engineer's experiences or observations). Based on the processing parameter data 120, the lithography processing models 135 may be embodied a database as a multi-dimensional (e.g., grid or matrix) structure. Further, the lithography processing models 135 may be arranged in any of a number of forms based on dimensions of items of the database unit 130.

In the example embodiment of FIG. 6, the mask layout processing tool 160 may include a model selector 165 to designate the lithography processing model 135 suitable for the IC layout 150. The model selector 165 may analyze the IC layout 150 based on pattern types and disposition structures of peripheral patterns, and may compare the analytic result with the database unit 130 to select one or more of the lithography processing models 135 suitable for a selected pattern. The selected lithography processing model 135 may be used in generating the mask layout 170 by the mask layout processing tool 160.

In the example embodiment of FIG. 6, the IC layout 170 may be generated from an IC layout generator 140 (e.g., a computer equipped with a CAD program), being used as input data to make a mask in accordance with a mask manufacturing process 190 with a mask manufacturing apparatus 180.

Figure 7A:
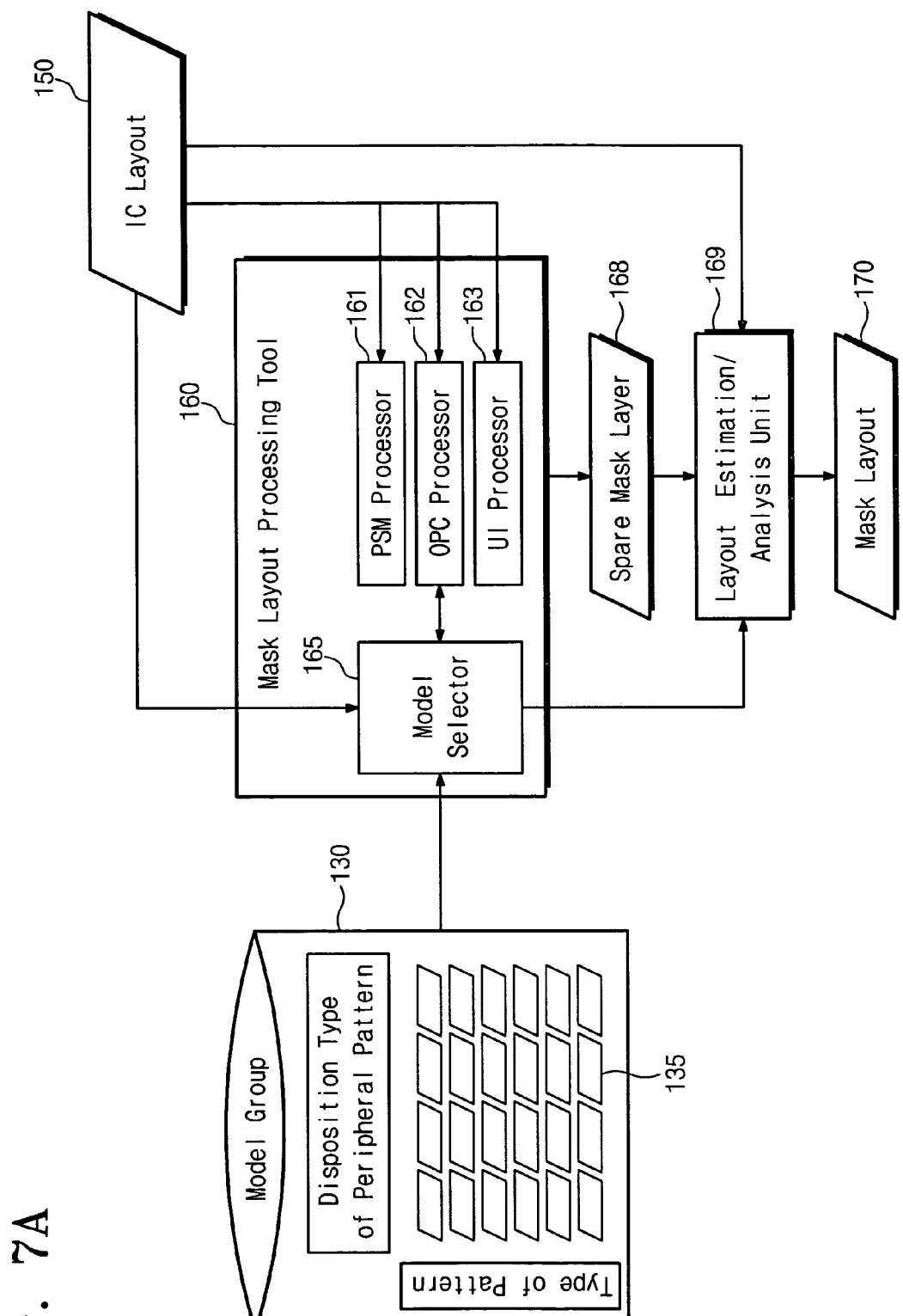
FIG. 7A illustrates a mask layout processing tool in accordance with an example embodiment of the invention.
Figure 8A:
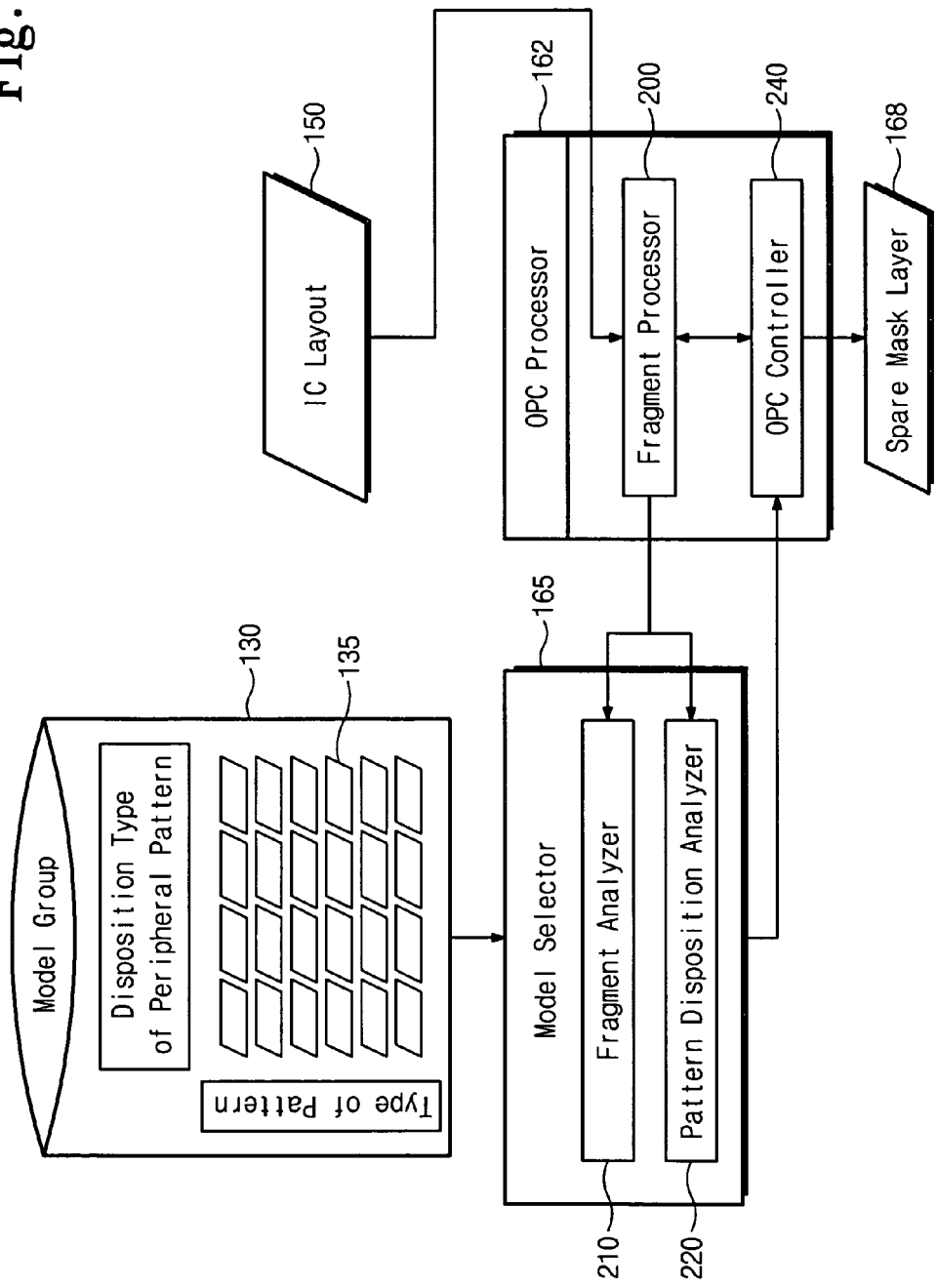
FIG. 8A illustrates an OPC processor and a model selector according to another example embodiment of the present invention.

FIG. 7A illustrates the mask layout processing tool 160 in accordance with an example embodiment of the invention. FIG. 8A illustrates an OPC processor and the model selector 165 according to another example embodiment of the present invention. While the example embodiments of FIGS. 7A and 8A may be employed separately, FIGS. 7A and 8A are described together below.

In the example embodiments of FIGS. 7A and 8A, the mask layout processing tool 160 may include a phase-shifting mask (PSM) processor 161, an OPC processor 162, a user interface (UI) processor 163 and the model selector 165. The PSM processor 161 may introduce phase-shifting mask (PSM) regions into the mask layout 170. The PSM regions may contribute to imprinting the target pattern with features having given dimensions (e.g., smaller than a wavelength of light) transmitting a photomask. The UI processor 163 may enable a user to monitor or correct partial and/or whole patterns defined by the layout.

In the example embodiments of FIGS. 7A and 8A, the OPC processor 162 may correct the IC layout 150 so as to reduce or prevent image distortion due to OPE. For this operation, the OPC processor 162 may include a fragment processor dividing patterns of the IC layout 150 into a plurality of fragments, and an OPC controller 240 executing an OPC operation for each fragment. The OPC controller 240 may correct the fragments via an OPC model designated by the model selector 165 so as to compensate for nonlinear distortion caused by optical diffraction and to resist a process effect. Such an OPC operation may use a given simulation for predicting a shape of the target pattern.

In the example embodiments of FIGS. 7A and 8A, the IC layout 150 corrected by the OPC processor 162 may constitute a spare mask layout 168. In an example, a layout estimation/analysis unit 169 may evaluate and analyze an acceptability (e.g., a pertinence and fidelity) of the spare mask layout 168. If the layout estimation/analysis unit 169 determines that the spare mask layout 168 is acceptable, the spare mask layout 168 may be used as the mask layout 170. Otherwise, if the layout estimation/analysis unit 169 determines that the spare mask layout 168 is not acceptable, the spare mask layout 168 may be re-corrected or re-adjusted by the mask layout processing tool 160. The layout estimation/analysis unit 169 may conduct a simulation using the spare mask layout 168 and may evaluate whether the spare mask layout 168 is sufficient to form a desired shape of the target pattern. In an example, the layout estimation/analysis unit 169 may include a simulator.

In the example embodiments of FIGS. 7A and 8A, the model selector 165 may analyze the IC layout 150 with reference to pattern types and disposition structures of peripheral patterns. In an example, the model selector 165 may include a fragment analyzer 210 evaluating types of the fragments, and a pattern disposition analyzer 220 evaluating disposition features adjacent to a selected fragment. While the fragment and pattern disposition analyzers 210 and 220 may separately analyze fragments and patterns, respectively, other example embodiments of the present invention may be directed to a combined analysis of fragments/patterns. Such an example embodiment will now be described in greater detail with reference to FIGS. 7B and 8B.

Figure 7B:
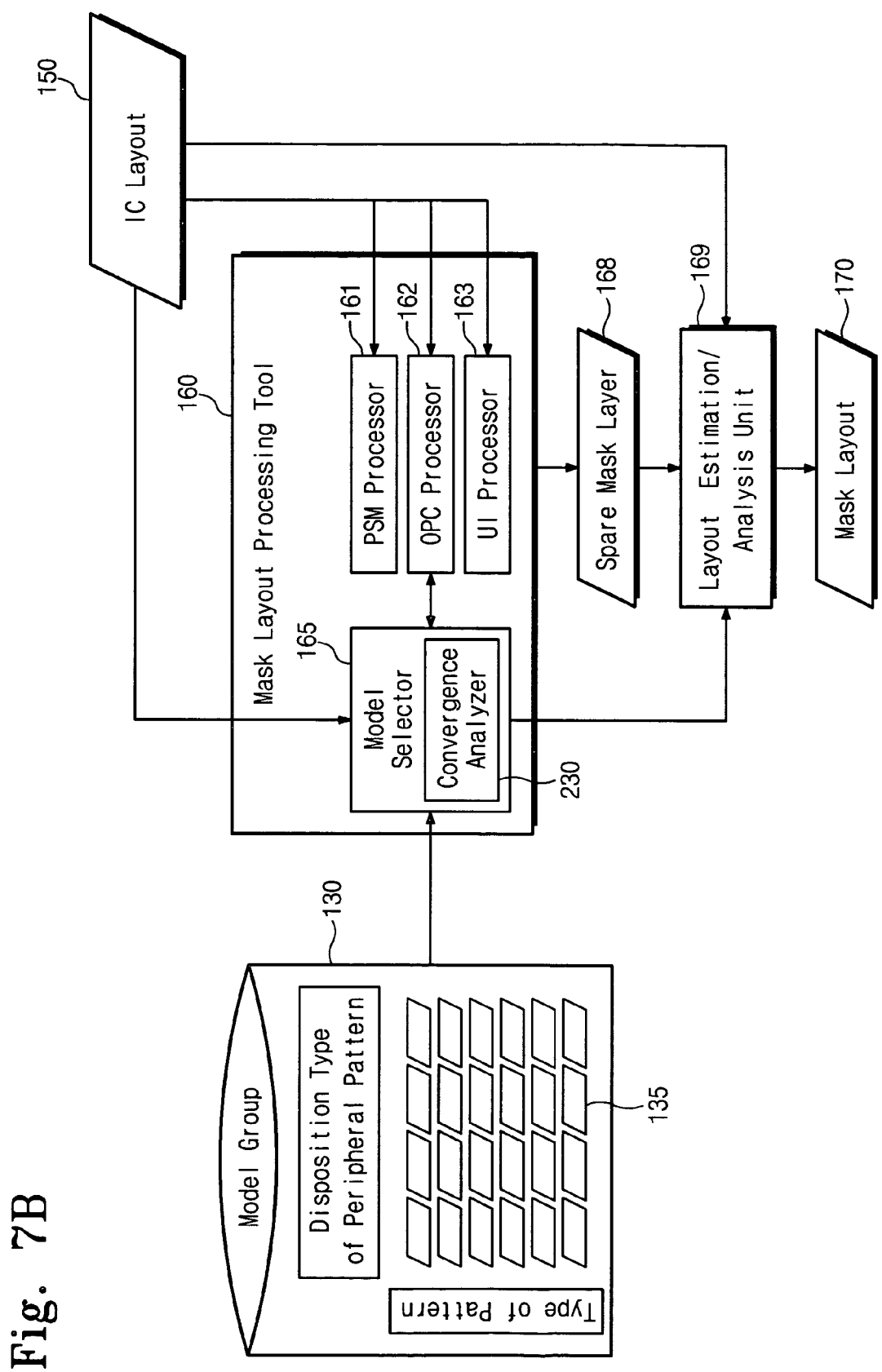
FIG. 7B illustrates another mask layout processing tool in accordance with another example embodiment of the invention.
Figure 8B:
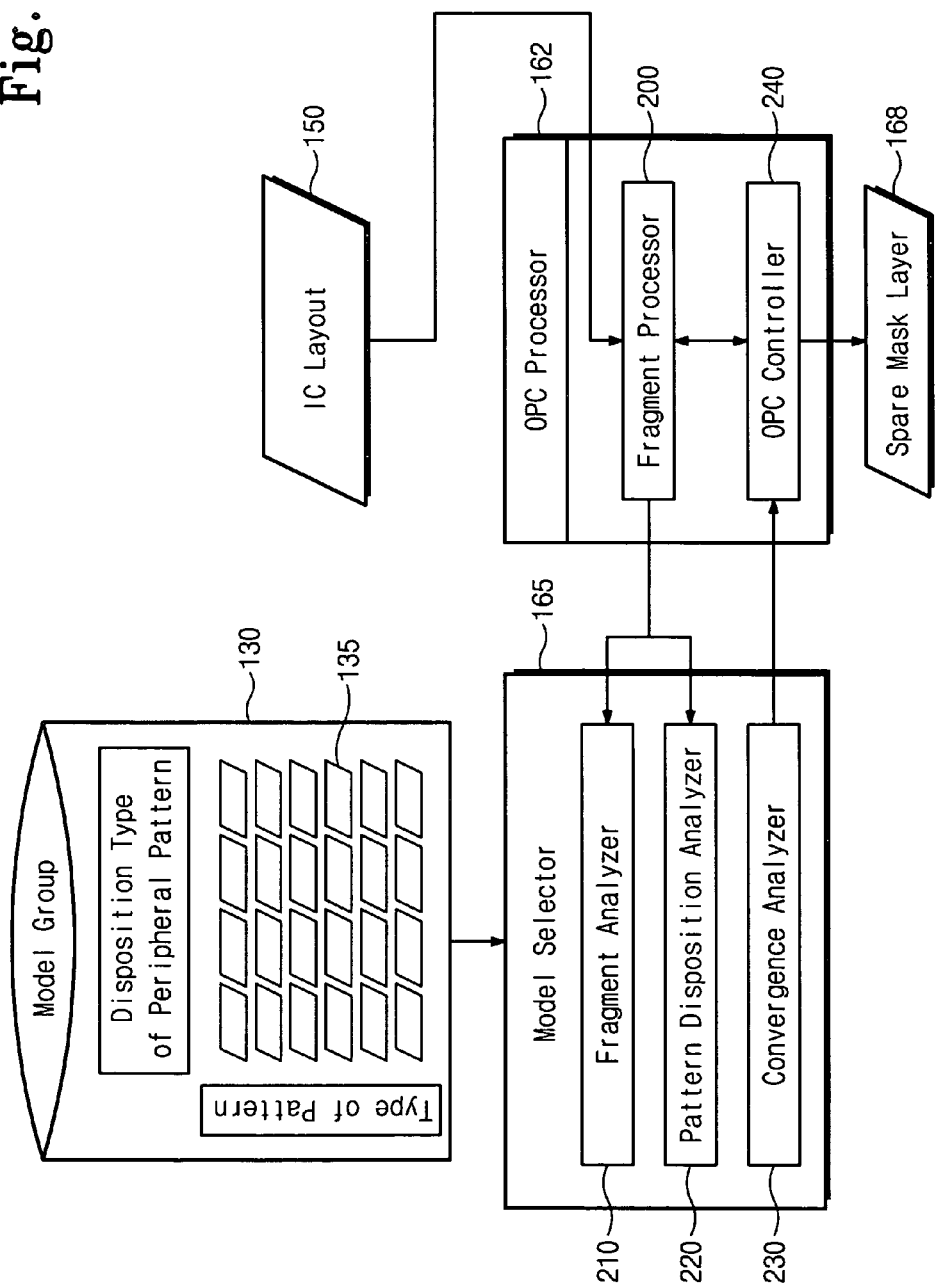
FIG. 8B illustrates another OPC processor and model selector in accordance with another example embodiment of the invention.
Figure 9A:
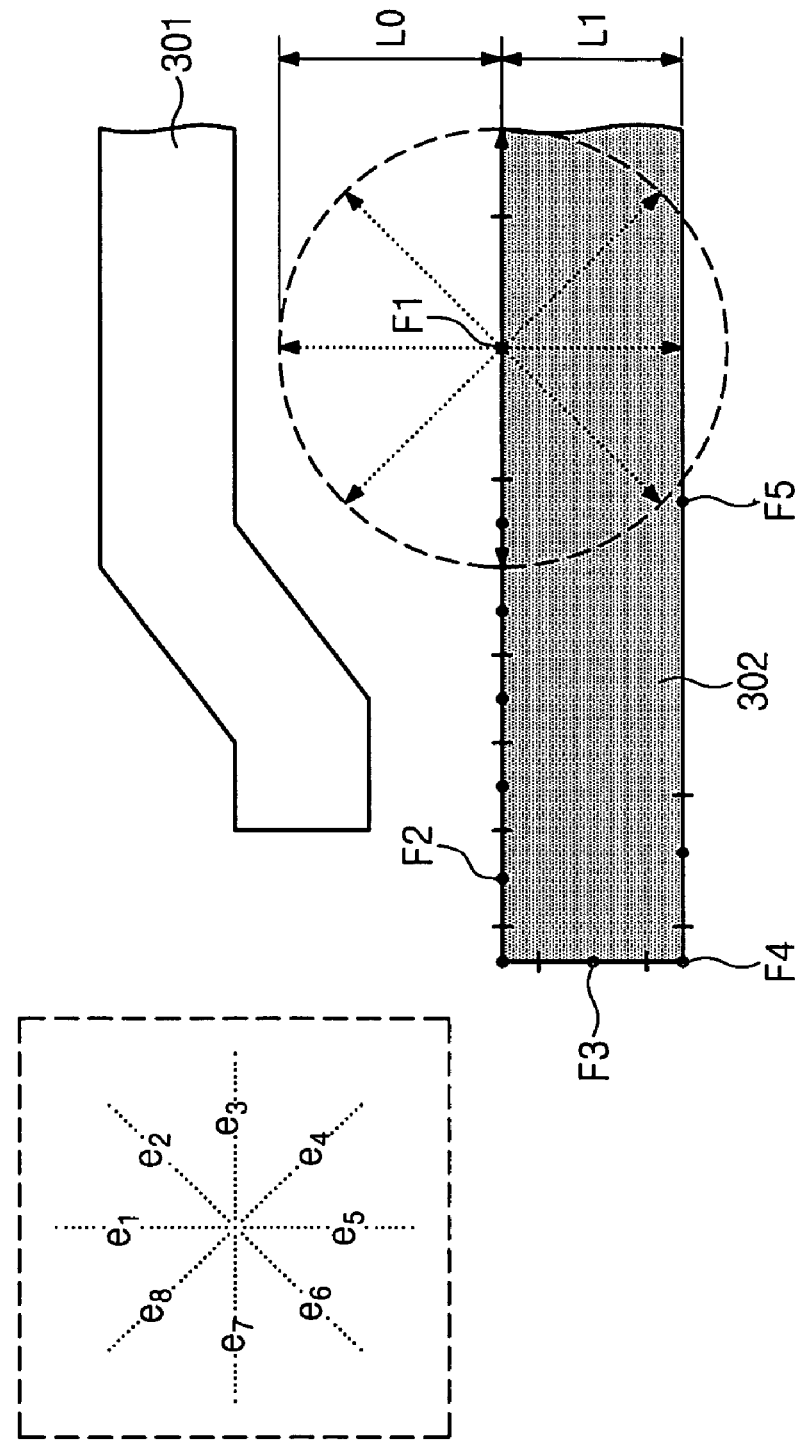
Figure 9D:
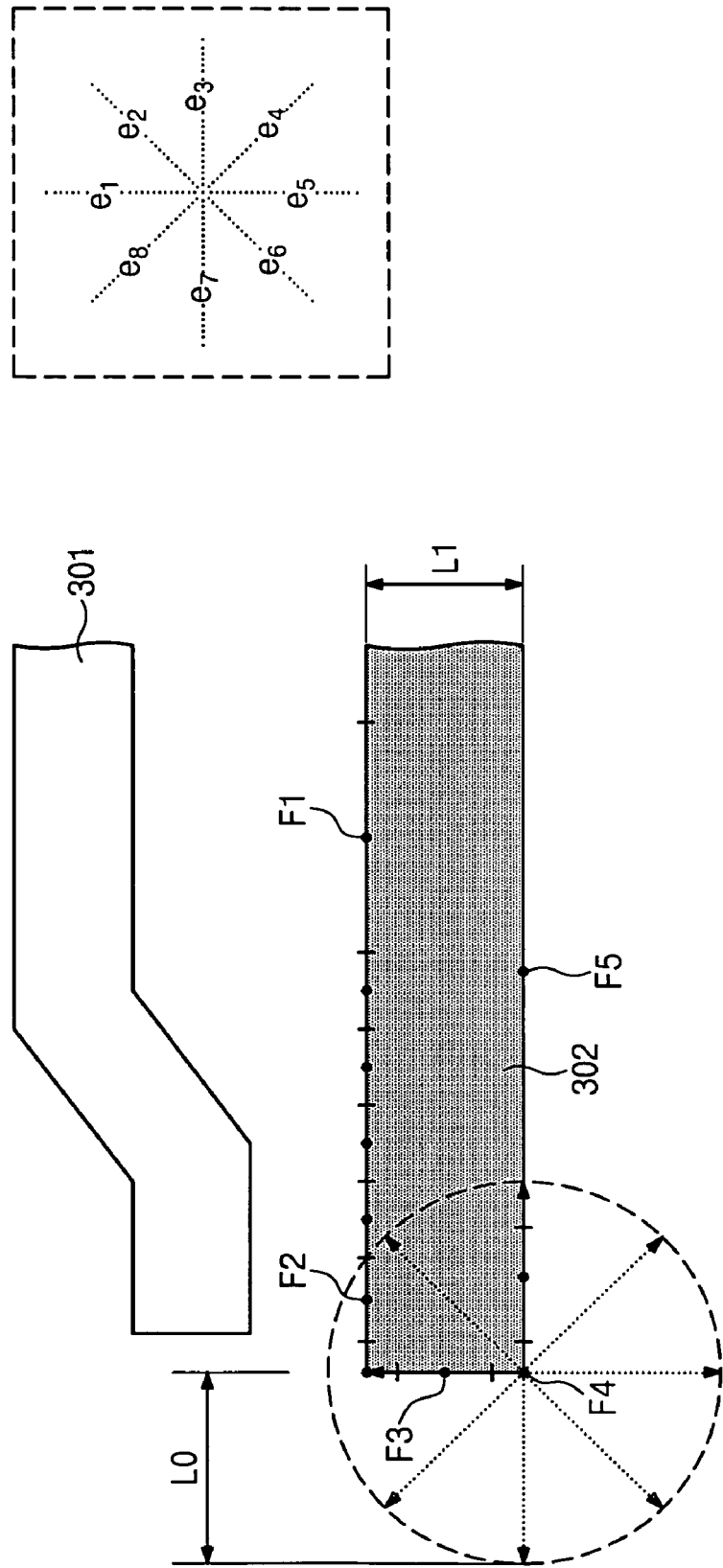

FIG. 7B illustrates the mask layout processing tool 160 in accordance with another example embodiment of the invention. FIG. 8B illustrates an OPC processor and the model selector 165 in accordance with another example embodiment of the invention. While the example embodiments of FIGS. 7B and 8B may be employed separately, FIGS. 7B and 8B are described together below. Generally, the example embodiments of FIGS. 7B and 8B may be similar to that of FIGS. 7A and 8A, except that a convergence analyzer may be further included. Therefore, a further description of common elements between FIGS. 7B and 8B and FIGS. 7A and 8A has been omitted for the sake of brevity.

In the example embodiment of FIGS. 7B and 8B, patterns constituting an IC may be configured in a number of shapes and/or disposition structures. Thus, a plurality of the OPC models 135 may be adaptable thereto in correspondence with a given fragment. A repetitive application with the OPC models 135 may increase an OPC processing time. The model selector 165 may include a convergence analyzer 230 configured to execute an algorithm that selectively applies a given OPC model into a fragment, thereby reducing a number of repetitive applications of the OPC models 135. In an example, the algorithm for selectively applying the OPC model to the fragment may be selective such that OPC model defined by, or association with, another condition are excluded from the repetitions. Thus, in certain cases, less than all of the OPC models 135 may be selectively applied to the fragment to reduce a processing time. However, if a given fragment were somehow associated with all of the stored OPC models 135, it is possible that all of the OPC models may be applied to adjust or correct an IC layout including the given fragment.

FIGS. 9A through 9E are diagrams illustrating a process of analyzing a pattern 302 from each fragment and a disposition type of a peripheral pattern 303 according to another example embodiment of the present invention. As shown in the example embodiments of FIGS. 9A through 9E, the procedure of analyzing types of patterns and dispositions may be performed on first through fifth fragments F1~F5.

In the example embodiments of FIGS. 9A through 9E, position-optical characteristics may be measured along eight radial directions for each of the fragments F1~F5, providing fragment data which may be represented as a function of direction and distance. For example, the measurement of the position-optical characteristics may be obtained from a simulation using the IC layout 150 as input data. The position-optical characteristics may be determined by analyzing an aerial image, which may be measured along distances from a selected fragment. The fragment data may be utilized as information for analyzing each fragment type and disposition structure of its peripheral patterns.

In the example embodiment of FIGS. 9A through 9E, L0 may denote a maximum displacement permissible in the procedure of measuring the position-optical characteristics, and L1 may denote a width of a selected pattern. Example position-optical characteristics of the selected fragments F1~F5 along the eight directions $e_1$~$e_8$ may be summarized in Table 1 (below). Referring to Table 1 (below), a reference sign (−) may represent a region without a pattern and (0) may indicate an interface of patterns. A reference sign (+) may denote a region with a pattern. Such regions may be differentiated by analyzing whether or not an intensity of a detected aerial image exceeds a given threshold. In Table 1, a reference symbol L0 may be used to indicate that no variation of pattern in the maximum range of displacement is permissible. For example, referring to Table 1 (below), an item '$e_3$: (+), L0' may indicate that a length of pattern selected at the $e_3$ direction is longer than the permissible maximum displacement, and '$e_2$: (−), <L0' may indicate that there is a peripheral pattern adjacent to the selected pattern along the $e_2$ direction. Accordingly, an analyzing process and condition of the measured result may be tailored to the preferences of a given user.

TABLE 1

|  | F1 | F2 | F3 | F4 | F5 |
|---|---|---|---|---|---|
| $e_1$ | (−), L0 | (−), <L0 | (0), <L0 | (0), <L0 | (+), <L0 |
| $e_2$ | (−), L0 | (−), <L0 | (+), <L0 | (+), L0 | (+), L0 |
| $e_3$ | (0), L0 | (0), L0 | (+), L0 | (0), L0 | (0), L0 |
| $e_4$ | (+), L0 | (+), L0 | (+), <L0 | (−), L0 | (−), L0 |
| $e_5$ | (+), <L0 | (+), <L0 | (0), <L0 | (−), L0 | (−), L0 |
| $e_6$ | (+), L0 | (+), L0 | (−), L0 | (−), L0 | (−), L0 |
| $e_7$ | (0), L0 | (0), <L0 | (−), L0 | (−), L0 | (0), L0 |
| $e_8$ | (−), L0 | (−), L0 | (−), L0 | (−), L0 | (+), L0 |

FIG. 10 is a diagram illustrating an example of application with an OPC model in accordance with another example embodiment of the present invention. FIG. 11 illustrates an example of a mask layout resulting from an OPC operation in accordance with another example embodiment of the present invention.

In the example embodiments of FIGS. 10 and 11, which of the OPC models are applied to each fragment may be determined independently, such that one pattern may be associated with a plurality of OPC models. In the example embodiment of FIG. 11, the reference numeral 303 may denote patterns inserted into the fragment, as a result of the OPC operation.

Example embodiments of the present invention may generally be directed to selecting one or more OPC models based on fragment characteristics of a fragment (e.g., a selected fragment type and a disposition structure of peripheral patterns adjacent thereto). Thereby, the selected OPC models may be more relevant than simply applying a generic OPC model to all fragments, thereby improving the results of the OPC process.

Figure 3:
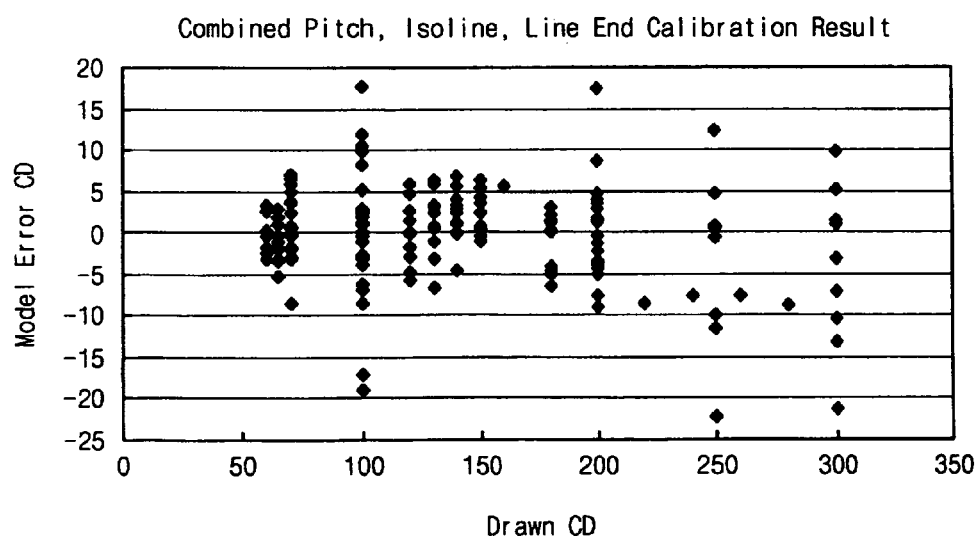
FIG. 3 is a graphic diagram showing gaps of fitting errors according to pattern architecture appearing through a conventional OPC process.
Figure 4:
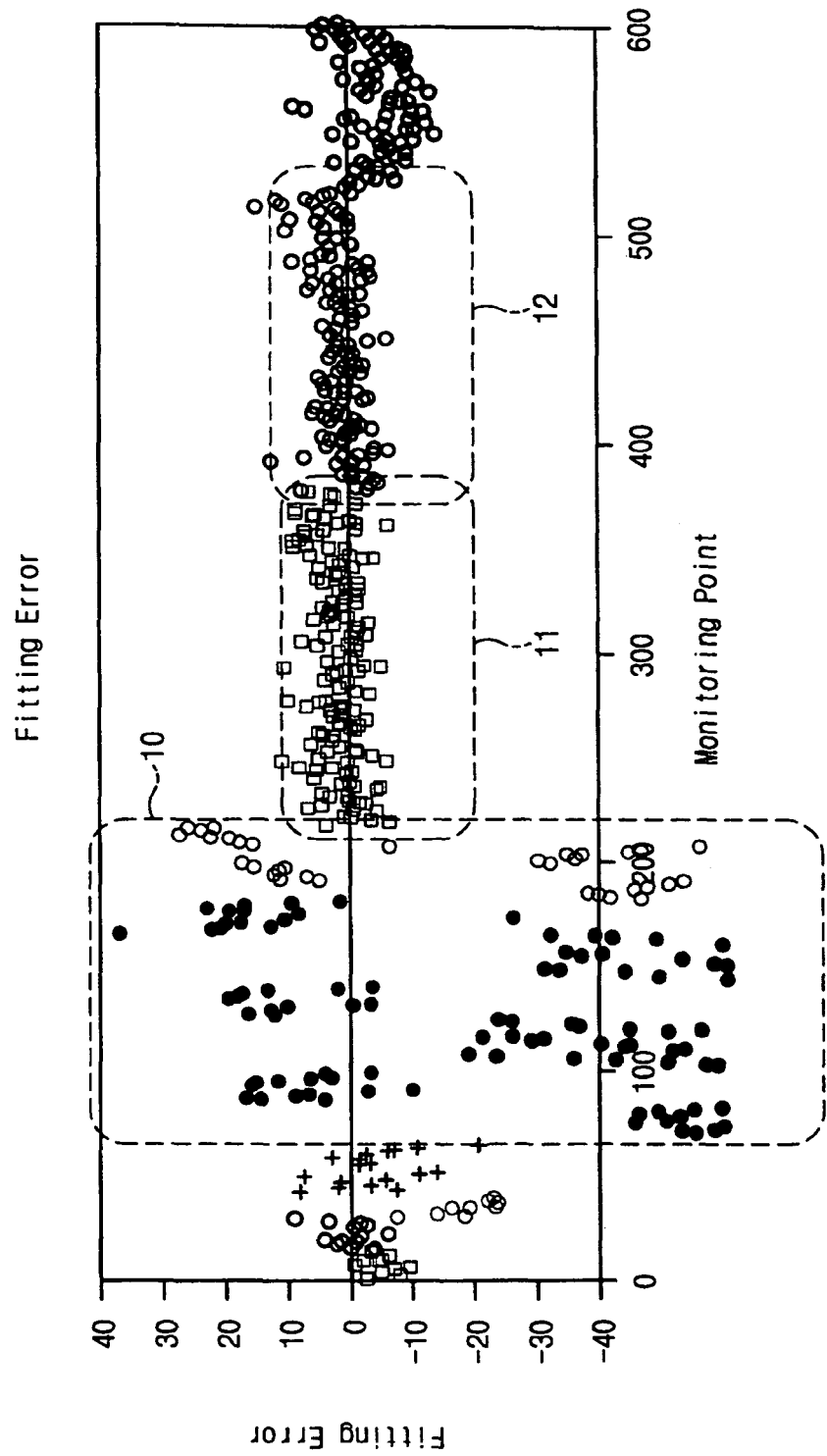
FIG. 4 is a graphic diagram showing fitting errors of a conventional OPC process employing a single OPC model.
Figure 5:
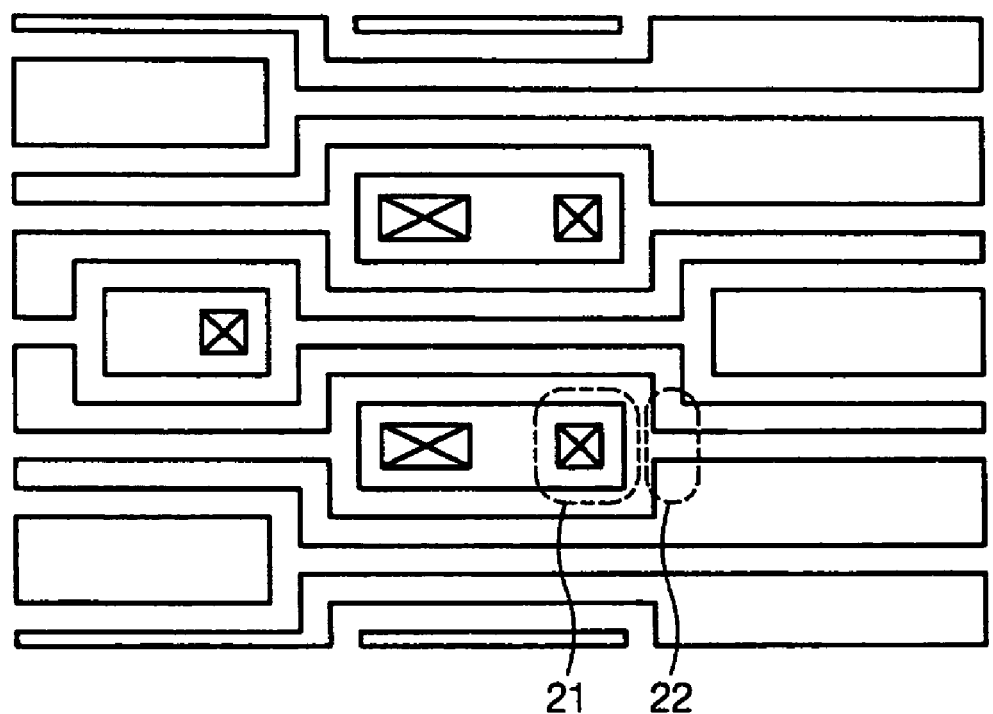
FIG. 5 illustrates a portion of the pattern architecture that may not be fixed by the conventional OPC process.
Figure 12A:
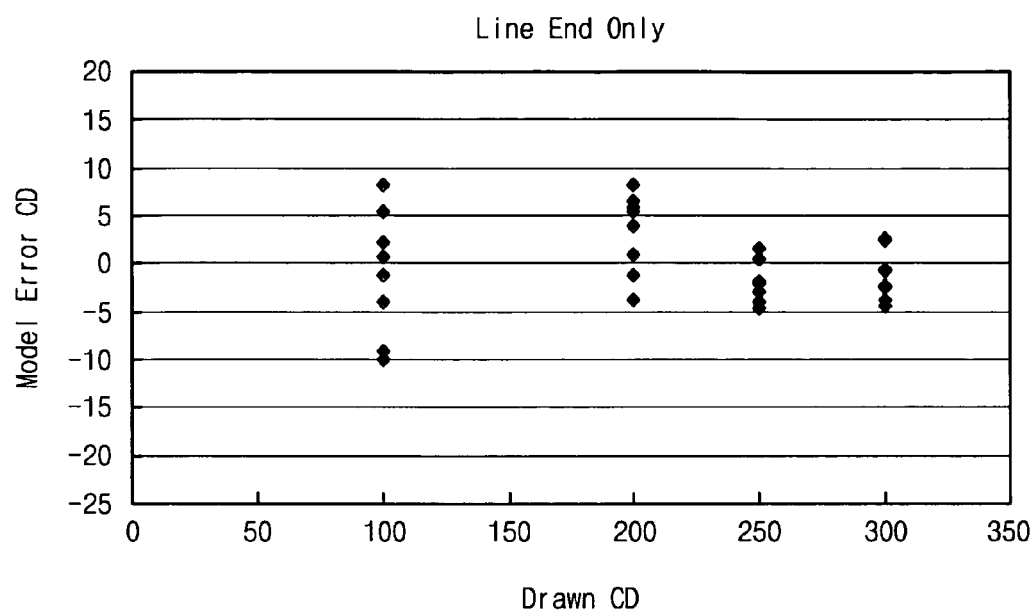
FIGS. 12A through 12C are graphic diagrams illustrating fitting errors of mask layout obtained by the OPC process performed in accordance with example embodiments of the present invention.
Figure 12B:
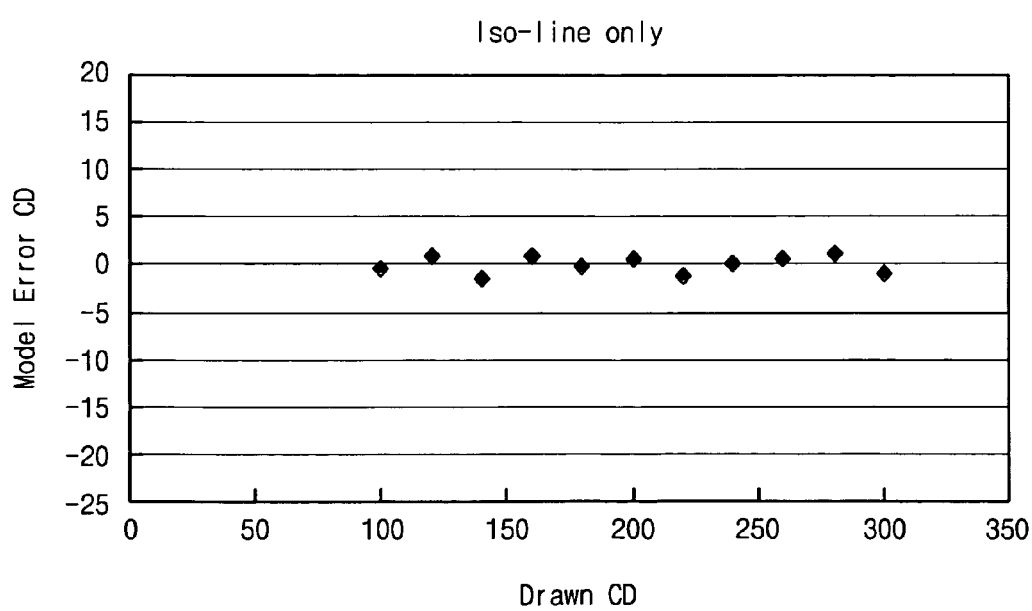
Figure 12C:
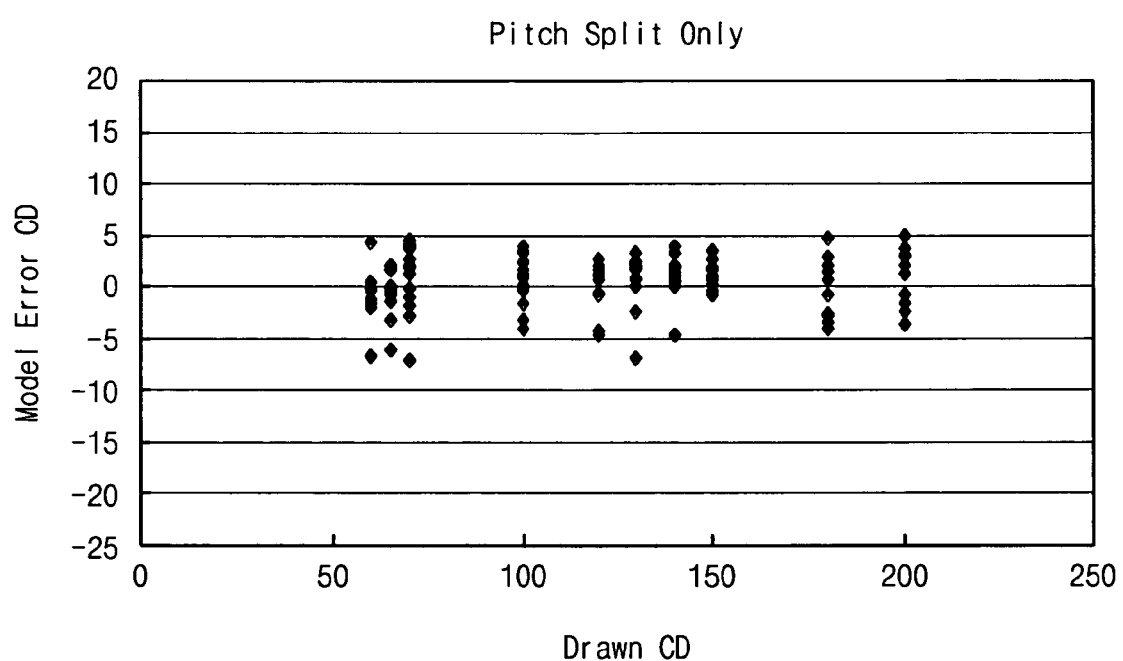

FIGS. 12A through 12C are graphic diagrams illustrating fitting errors of mask layout obtained by the OPC process performed in accordance with example embodiments of the present invention. In particular, FIG. 12A illustrates fitting errors measured from line-and-space patterns, FIG. 12B illustrates fitting errors measured from fixed-bar patterns, and FIG. 12C illustrates fitting errors measured from line-end patterns. A comparison of the graphic diagrams of FIGS. 12A through 12C with FIG. 3 will indicate that the OPC process performed in accordance with example embodiments of the present invention may improve upon the conventional distribution of FIG. 3.

In another example embodiment of the present invention, an OPC model used for an OPC process may be independently selected for each of a plurality of fragments based on fragment characteristics (e.g., a shape and disposition of the selected pattern fragment). Thus, an increase of fitting error size and distribution profile (e.g., arising from a generic application of a single OPC model to an entire layout) may be limited or reduced.

Example embodiments of the present invention being thus described, it will be obvious that the same may be varied in many ways. For example, while the example embodiments of the present invention refer to measurements taken along eight radial directions, it is understood that measurements may be taken along any number of directions in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. An optical proximity correction (OPC) system, comprising:
    an integrated circuit (IC) layout generation unit configured to generate an IC layout including a plurality of fragments;
    a database unit storing a set of OPC models, each of the OPC models being configured to correct optical proximity effects on a target pattern depending on target specific characteristics including at least a type of the target pattern and a disposition type of peripheral pattern relative to the target pattern; and
    a mask layout generation unit including a model selector, the mask layout generation unit being configured to generate a mask layout including a plurality of mask layout patterns,
    wherein the model selector is configured to select at least one suitable OPC model from among the set of OPC models for each of the plurality of fragments by comparing a selected fragment with target patterns of the OPC models in target specific characteristics, and wherein comparing the selected fragment includes analyzing each of the plurality of fragments by evaluating a plurality of areas around each fragment, evaluating the plurality of areas including determining, for each area, whether the area is associated with a region of a pattern to which the fragment belongs, a region having no pattern, or a region on an interface of the pattern to which the fragment belongs.

2. The OPC system of claim 1, wherein the set of OPC models stored in the database unit are generated by analyzing lithography data, obtained via a test mask, the test mask conforming to at least one of the plurality of target specific characteristics.

3. The OPC system of claim 1, wherein the set of OPC models stored in the database unit are generated by analyzing an affect of a lithography process in accordance with variations of processing parameters.

4. The OPC system of claim 1, wherein the mask layout generation unit includes a fragment processor dividing the IC layout into the plurality of fragments.

5. The OPC system of claim 4, wherein the model selector includes:
    a fragment analyzer configured to analyze a type of each of the plurality of fragments divided by the fragment processor; and
    a pattern disposition analyzer configured to analyze a disposition type of peripheral patterns adjacent to each of the plurality of fragments divided by the fragment processor.

6. The OPC system of claim 5, wherein the pattern disposition analyzer determines the disposition type of the adjacent pattern by analyzing position-optical characteristics of each fragment measured along at least two directions.

7. The OPC system of claim 5, wherein the at least one suitable OPC model determined based on a type of each fragment as determined by the fragment analyzer and a disposition type of peripheral patterns is determined by the pattern disposition analyzer.

8. The OPC system of claim 5, wherein the mask layout generation unit further includes:
    an OPC controller applying the selected at least one suitable OPC model to one of the plurality of fragments.

9. The OPC system of claim 5, wherein the mask layout generation unit further includes:
    a convergence analyzer determining whether more than one of the set of OPC models is to be applied to one of the plurality of fragments.

10. The OPC system of claim 1, wherein the mask layout generation unit further includes:
    a phase-shifting mask processor treating the IC layout for making a phase-shifting mask; and
    a user interface conveying information to a user and receiving user feedback from the user.

11. The OPC system of claim 1, further comprising:
    a layout estimation/analysis unit including a simulator estimating a resultant structure based on the mask layout, wherein the layout estimation/analysis unit is configured to determine whether the generated mask layout is acceptable by the simulator.

12. The OPC system of claim 1, wherein each of the plurality of areas is associated with a direction with respect to a center point of the fragment, and evaluating the plurality of areas around each fragment includes evaluating areas associated with at least 8 different directions.

13. The OPC system of claim 1, wherein each of the plurality of areas is associated with a direction with respect to a center point of the fragment, and evaluating the plurality of areas around each fragment includes evaluating areas associated with at least 8 different directions.

14. A method of correcting an optical proximity effect (OPE), comprising:
   storing a set of optical proximity correction (OPC) models, each of the OPC models being configured to correct optical proximity effects on a target pattern depending on target specific characteristics including at least a type of the target pattern and a disposition type of peripheral pattern relative to the target pattern;
   generating an IC layout including a plurality of fragments;
   selecting at least one suitable OPC model from among the set of OPC models for each of the plurality of fragments by comparing a selected fragment with target patterns of the OPC models in target specific characteristics,
   generating a mask layout based on the generated IC layout and the selected OPC model suitable for each of the plurality of fragments,
   wherein comparing the selected fragment includes analyzing each of the plurality of fragments by evaluating a plurality of areas around each fragment, evaluating the plurality of areas including determining, for each area, whether the area is associated with a region of a pattern to which the fragment belongs, a region having no pattern, or a region on an interface of the pattern to which the fragment belongs.

15. The method of claim 14, wherein the set of OPC models are generated by analyzing lithography data, obtained via a test mask, the test mask conforming to at least one of the plurality of target specific characteristics.

16. The method of claim 14, wherein the set of OPC models are generated by analyzing an affect of a lithography process in accordance with variations of processing parameters.

17. The method of claim 14, wherein selecting the OPC model suitable for each of the plurality of fragments includes:
   segmenting a pattern of the generated IC layout into a plurality of fragments based on an analysis of the generated IC layout;
   analyzing target specific characteristics for each of the plurality of fragments; and
   selecting at least one OPC model for each of the plurality of fragments based on a comparison between the analyzed target specific characteristics and the target specific characteristics associated with the set of OPC models.

18. The method of claim 17, wherein analyzing the target specific characteristics of each of the fragments includes an analysis of the fragment type and the peripheral disposition type of the fragment, and includes, for each of the plurality of fragments:
   preparing fragment data for a given one of the plurality of fragments represented in a function of direction and distance by measuring position-optical characteristics along at least two directions of each fragment of the plurality of fragments; and
   determining a fragment type and a peripheral disposition type for the given one of the plurality of fragments by analyzing the fragment data.

19. The method of claim 18, wherein preparing the fragment data includes measuring the position-optical characteristics along eight radial directions of the given one of the plurality of fragments.

20. The method of claim 18, wherein the position-optical characteristics are obtained from a simulation using the generated IC layout as input data.

21. The method of claim 18, wherein the position-optical characteristics are obtained by analyzing an aerial image for each of the plurality of fragments.

22. The method of claim 17, wherein selecting the at least one OPC model for each of the plurality of fragments further includes:
   determining whether more than one of the set of OPC models is to be applied to one of the plurality of fragments.

23. The method of claim 14, further comprising:
   determining whether the generated mask layout is acceptable, by executing a simulation to simulate a result of a lithography operation based on of the generated mask layout.

* * * * *